(12) United States Patent
Xie et al.

(10) Patent No.: US 10,148,083 B2
(45) Date of Patent: Dec. 4, 2018

(54) FAULT CURRENT-SUPPRESSING DAMPER TOPOLOGY CIRCUIT AND CONTROL METHOD THEREOF AND CONVERTER

(71) Applicants: NR ELECTRIC CO., LTD, Jiangsu (CN); NR ENGINEERING CO., LTD, Jiangsu (CN)

(72) Inventors: Yeyuan Xie, Jiangsu (CN); Minglian Zhu, Jiangsu (CN); Tiangui Jiang, Jiangsu (CN); Chuanjun Bo, Jiangsu (CN); Min Li, Jiangsu (CN)

(73) Assignees: NR ELECTRIC CO., LTD, Jiangsu (CN); NR ENGINEERING CO., LTD, Jiangsu (CN)

(*) Notice: Subject to any disclaimer, the term of this patent is extended or adjusted under 35 U.S.C. 154(b) by 0 days.

(21) Appl. No.: 15/570,750

(22) PCT Filed: Jul. 13, 2016

(86) PCT No.: PCT/CN2016/089946
§ 371 (c)(1),
(2) Date: Oct. 31, 2017

(87) PCT Pub. No.: WO2017/000925
PCT Pub. Date: Jan. 5, 2017

(65) Prior Publication Data
US 2018/0183231 A1    Jun. 28, 2018

(30) Foreign Application Priority Data
Jul. 1, 2015 (CN) .......................... 2015 1 0379965

(51) Int. Cl.
*H02H 7/12* (2006.01)
*H03K 17/0814* (2006.01)
(Continued)

(52) U.S. Cl.
CPC ..... *H02H 7/1203* (2013.01); *H03K 17/08116* (2013.01); *H03K 17/08146* (2013.01);
(Continued)

(58) Field of Classification Search
CPC ................. H02H 7/1203; H03K 17/08116
(Continued)

(56) References Cited

U.S. PATENT DOCUMENTS 6,650,523 B1    11/2003    Kleemeier et al.
2005/0280972 A1*    12/2005    Jonsson ................. H02H 9/002
361/111
(Continued)

FOREIGN PATENT DOCUMENTS

CN    102118019    7/2011
CN    102611096    7/2012
(Continued)

OTHER PUBLICATIONS

Received STIC search report from EIC 2800 searcher Mesfin Getaneh dated May 3, 2018.*
(Continued)

*Primary Examiner* — Timothy J Dole
*Assistant Examiner* — Htet Z Kyaw
(74) *Attorney, Agent, or Firm* — JCIPRNET

(57) ABSTRACT

Disclosed are a fault current-suppressing damper topology circuit and a control method thereof and a converter. An anode of a separate diode is connected to a positive electrode of a second switch module, a cathode of the separate diode is connected to one end of an energy storage capacitor, and the other end of the energy storage capacitor is connected to a negative electrode of a first switch module; a damping resistor is connected in parallel with an arrester and then with the first switch module; a bypass switch is connected in parallel between a terminal x1 and a terminal x2 of the
(Continued)

damper topology circuit; a power supply system acquires energy from the energy storage capacitor and supplies power to a control system; and the control system controls an operating state of the damper topology circuit by controlling the bypass switch, the first switch module and the second switch module. The fault current-suppressing damper topology circuit is applied to voltage source converters. In case of a DC fault, stress resulting from fault currents is reduced by use of a damping resistor, thereby avoiding damages to a device and achieving self-power supply, modularization and independent control. The fault current-suppressing damper topology circuit can be flexibly applied to various types of voltage source converters and has outstanding economic efficiency and technicality.

13 Claims, 6 Drawing Sheets

(51) Int. Cl.
H02M 7/5387 (2007.01)
H02M 1/32 (2007.01)
H03K 17/081 (2006.01)
H02M 7/483 (2007.01)

(52) U.S. Cl.
CPC ............ *H02M 1/32* (2013.01); *H02M 7/5387* (2013.01); *H02M 2007/4835* (2013.01)

(58) Field of Classification Search
USPC ............................................ 363/50
See application file for complete search history.

(56) References Cited

U.S. PATENT DOCUMENTS

| 2014/0328093 | A1* | 11/2014 | Zhang ...................... H02M 1/32 363/51 |
| 2015/0229121 | A1* | 8/2015 | Davidson ........... H03K 17/0828 361/54 |
| 2016/0126827 | A1* | 5/2016 | Dong ...................... H02M 1/32 363/50 |
| 2016/0226480 | A1* | 8/2016 | Marquardt ................ H02J 3/36 |
| 2016/0268915 | A1* | 9/2016 | Lin .......................... H02M 1/32 |
| 2017/0047727 | A1* | 2/2017 | Cao .......................... H02M 1/32 |
| 2017/0070047 | A1* | 3/2017 | Shen ......................... H02J 3/36 |

FOREIGN PATENT DOCUMENTS

| CN | 102801295 | 11/2012 |
| CN | 104052026 | 9/2014 |

OTHER PUBLICATIONS

Received STIC search report from EIC 2800 searcher Samir Patel dated May 1, 2018.*

"International Search Report (Form PCT/ISA/210)", dated Oct. 20, 2016, with English translation thereof, pp. 1-4.

* cited by examiner

FAULT CURRENT-SUPPRESSING DAMPER TOPOLOGY CIRCUIT AND CONTROL METHOD THEREOF AND CONVERTER

CROSS-REFERENCE TO RELATED APPLICATION

This application is a 371 application of the international PCT application serial no. PCT/CN2016/089946, filed on Jul. 13, 2016, which claims the priority benefit of China application no. 201510379965.0, filed on Jul. 1, 2015. The entirety of each of the abovementioned patent applications is hereby incorporated by reference herein and made a part of this specification.

FIELD OF THE INVENTION

The present invention relates to the field of power electronics, and particularly to a damper topology circuit for suppressing a fault current.

BACKGROUND OF THE INVENTION

A voltage source converter technique is a novel converter technique based on a turn-off device IGBT (Insulated Gate Bipolar Transistor) technique and a pulse width modulation (PWM) technique. In a low voltage application, a two-level converter composed of IGBTs is widely applied. To address a high-frequency transition of an output voltage of the converter, problems such as high dv/dt stress, large system losses, high noise and harsh electromagnetic environment, may be caused. Therefore, a three-level voltage source converter is proposed, which expands the application range of a voltage source converter in terms of voltage level and capacity.

With the emergence of a modular multilevel converter (MMC), a multilevel converter is successfully applied in the field of Voltage Source Converter-High Voltage Direct Current Transmission (VSC-HVDC), where the voltage level reaches hundreds of kilovolts, and the capacity reaches several gigabytes.

However, all voltage source converters have an inherent defect in which a direct current (DC) fault cannot be effectively handled. When a short-circuit fault occurs at a DC side, even if the converter has been blocked, an (alternating current) AC power supply still can inject a current to a short-circuit point via an anti-parallel diode of an IGBT so as to form a freewheel passage, so that fault clearing becomes difficult. Thus, how to solve or relieve the problem of the DC fault of a voltage source converter becomes a key technical factor for solving the problems in the development of DC interconnection technology.

In view of this, the present inventors have proposed a suppression means from a standpoint of the mechanism of DC fault currents of a voltage source converter, resulting in the present application.

SUMMARY OF THE INVENTION

An object of the present invention is to provide a fault current-suppressing damper topology circuit and a control method thereof and a converter. The present invention is applied to a voltage source converter, and can reduce current stress of a power semiconductor switch in the converter by use of a damping resistor when a fault occurs at a DC side of the converter, thereby protecting the IGBT device, and has better performance in both economic efficiency and technicality.

In order to achieve the above object, a solution of the present invention is: an fault current-suppressing damper topology circuit, including: a first switch module, a second switch module, a separate diode D3, an energy storage capacitor C1, a damping resistor R1, an arrester DL, a bypass switch K1, a power supply system, and a control system, a positive electrode of the first switch module is connected to a leading-out terminal x2 of the damper topology circuit, and a negative electrode of the first switch module is connected to a negative electrode of the second switch module; a positive electrode of the second switch module T2 is connected to a leading-out terminal x1 of the damper topology circuit; the first switch module includes a switch tube T1 and a freewheel diode D1 in anti-parallel with the switch tube T1; the second switch module includes a switch tube T2 and a freewheel diode D2 in anti-parallel with the switch tube T2; a positive electrode of the switch tube T1 is the positive electrode of the first switch module, a negative electrode of the switch tube T1 is the negative electrode of the first switch module, a positive electrode of the switch tube T2 is the positive electrode of the second switch module, and a negative electrode of the switch tube T2 is the negative electrode of the second switch module; an anode of the separate diode is connected to the positive electrode of the second switch module, a cathode of the separate diode is connected to one end of the energy storage capacitor, and the other end of the energy storage capacitor is connected to the negative electrode of the first switch module; the damping resistor R1 is connected in parallel with the arrester DL and then connected in parallel between the positive electrode and the negative electrode of the first switch module; the bypass switch K1 is connected in parallel between the terminal x1 and the terminal x2 of the damper topology circuit; the power supply system acquires energy from the energy storage capacitor C1 and supplies power to the control system; the control system controls an operating state of the damper topology circuit by sending a control signal to the bypass switch K1, the first switch module and the second switch module.

Further, the operating state of the damper topology circuit is an activation forward current charge state, a bidirectional current flow state, a forward current recharging state, a fault current damping state, or a fault bypass state:

(1) activation forward current charge state: the control system does not send the control signal, the bypass switch K1 is turned off and the switch tube T1 and the switch tube T2 are also turned off; and a forward current flows through the freewheel diode D2, the energy storage capacitor C1 and the freewheel diode D1, such that the energy storage capacitor C1 is charged by the separate diode D3 and the freewheel diode D1; (2) bidirectional current flow state: the control system controls the switch tube T1 and the switch tube T2 to be turned on, such that currents can flow bidirectionally; and a forward current flows through the switch tube T2 and the freewheel diode D1, and a reverse current flows through the switch tube T1 and the freewheel diode D2;

(3) forward current recharging state: the control system controls the switch tube T1 to be turned on and the switch tube T2 to be turned off, at a forward current, such that the forward current charges the energy storage capacitor C1 by the separate diode D3 and the freewheel diode D1;

(4) fault current damping state: in case of an external fault of the damper topology circuit, the control system controls the switch tube T1 and the switch tube T2 to be turned off, and a fault current flows through the freewheel diode D2 and the damping resistor R1 to suppress the fault current;

(5) fault bypass state: in case of an inner fault of the damper topology circuit, the control system controls the bypass switch K1 to be turned on to cut off the fault current-suppressing damper topology circuit.

Further, the switch tubes T1 and T2 each are an IGBT, an IGCT, a GTO, or a MOSFET.

Further, the second switch module is a bidirectional thyristor.

Further, the bypass switch K1 has a post-closing mechanical retention function, and can retain a closed state after a power off.

The second technical solution of the present invention is: a control method of the fault current-suppressing damper topology circuit as described above, characterized in that: a control system sends a control signal to cause the fault current-suppressing damper topology circuit to operate in one of five operating states below:

(1) activation forward current charge state: the control system does not send the control signal, the bypass switch K1 is turned off and the switch tube T1 and the switch tube T2 are also turned off; and a forward current flows through the freewheel diode D2, the energy storage capacitor C1 and the freewheel diode D1, such that the energy storage capacitor C1 is charged by the separate diode D3 and the freewheel diode D1; (2) bidirectional current flow state: the control system controls the switch tube T1 and the switch tube T2 to be turned on, such that currents can flow bidirectionally; and a forward current flows through the switch tube T2 and the freewheel diode D1, and a reverse current flows through the switch tube T1 and the freewheel diode D2;

(3) forward current recharging state: the control system controls the switch tube T1 to be turned on and the switch tube T2 to be turned off, at a forward current, such that the forward current charges the energy storage capacitor C1 by the separate diode D3 and the freewheel diode D1;

(4) fault current damping state: in case of an external fault of the damper topology circuit, the control system controls the switch tube T1 and the switch tube T2 to be turned off, and a fault current flows through the freewheel diode D2 and the damping resistor R1 to suppress the fault current;

(5) fault bypass state: in case of an inner fault of the damper topology circuit, the control system controls the bypass switch K1 to be turned on to cut off the fault current-suppressing damper topology circuit.

The third technical solution of the present invention is: a bridge arm damping modular multilevel converter, including an upper bridge arm and a lower bridge arm, characterized in that: the upper bridge arm and the lower bridge arm each include at least one fault current-suppressing damper topology circuit as described above.

Further, the upper bridge arm and the lower bridge arm each include at least two half-bridge connected converter module units cascaded with each other; the converter module units in the upper bridge arm are connected in the same direction, and the converter module units in the lower bridge arm are also connected in the same direction; a first leading-out terminal of a first converter module unit in the upper bridge arm is a positive pole P of the modular multilevel converter, and a second leading-out terminal of a last converter module unit in the lower bridge arm is a negative pole N of the modular multilevel converter; the positive pole P and the negative pole N both are used to access a DC network; a second leading-out terminal of a last converter module unit in the upper bridge arm and a first leading-out terminal of a first converter module unit in the lower bridge arm are connected with each other, and the connection point is an AC endpoint of the modular multilevel converter and used to access an AC network.

Further, the fault current-suppressing damper topology circuit is a module unit type, and compatible with the structure of the converter module unit. The fault current-suppressing damper topology circuits may be installed according to the locations of the converter module units.

The fourth technical solution of the present invention is: a damping type two-level converter, including a phase unit, the phase unit including cascaded switch modules, characterized in that: the damping type two-level converter further includes: at least one fault current-suppressing damper topology circuit described above connected in series with the switch modules.

Further, the fault current-suppressing damper topology circuit according to any one of claims 1-5 is also connected in series between the DC capacitor and the switch module.

The fifth technical solution of the present invention is: a damping type multilevel converter, including a phase unit, the phase unit including at least one fault current-suppressing damper topology circuit described above which is cascaded.

The sixth technical solution of the present invention is: a method for protecting the modular multilevel converter described above, characterized in that, including the steps of:

(1) detecting and determining whether a short-circuit fault occurs at a DC side;

(2) if so, applying a turn-off signal to all switch modules connected in series in the modular multilevel converter;

(3) restoring system operation after the decay of a fault current is completed.

Compared with the prior art, the beneficial effects of the present invention are that:

(1) a damper topology circuit of the present invention limits a short-circuit current peak and effectively protects the safety of a switch module device and a capacitor, in case of a DC fault of a voltage source converter;

(2) the damper topology circuit enables rapid delay of a DC fault current, facilitating fast fault clearing and restoration of operation of the converter;

(3) the damper topology circuit can quickly and effectively suppress a DC short-circuit current and damp the current oscillation in a multi-terminal DC system composed of modular multilevel converters, such that the safety of the device is protected and the decay time of the fault current and thus the DC outage time are greatly shortened, and economic losses and the risk of system instability caused by the outage are further reduced to a maximum extent;

(4) the damper topology circuit has a self-power supply function, can be flexibly connected in series at any position of the converter, has flexible control and good independence, does not compromise the reliability of the original system, and has practical value.

DETAILED DESCRIPTION OF THE EMBODIMENTS

The technical solutions of the present invention are described in detail below with reference to the accompanying drawings.

Embodiment 1

Figure 1:
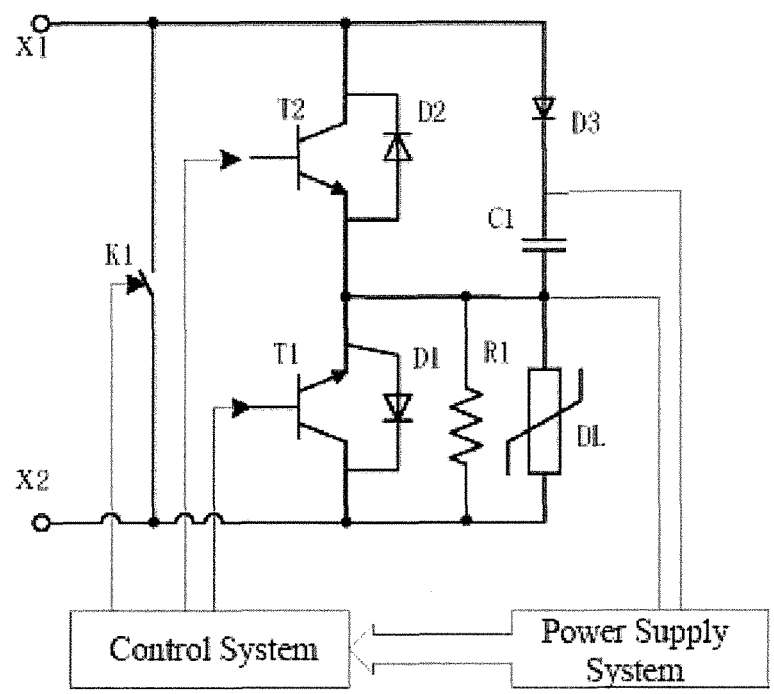
FIG. 1 shows a structure of a fault current-suppressing damper topology circuit of the present invention.

Referring to FIG. 1, a fault current-suppressing damper topology circuit includes a first switch module, a second switch module, a separate diode D3, an energy storage capacitor C1, a damping resistor R1, an arrester DL, a bypass switch K1, a power supply system, and a control system. A positive electrode of the first switch module is connected to a leading-out terminal x2 of the damper topology circuit, and a negative electrode of the first switch module is connected to a negative electrode of the second switch module. A positive electrode of the second switch module T2 is connected to a leading-out terminal x1 of the damper topology circuit. The first switch module includes a switch tube T1 and a freewheel diode D1 in anti-parallel with the switch tube T1. The second switch module includes a switch tube T2 and a freewheel diode D2 in anti-parallel with the switch tube T2. A positive electrode of the switch tube T1 is the positive electrode of the first switch module, a negative electrode of the switch tube T1 is the negative electrode of the first switch module, a positive electrode of the switch tube T2 is the positive electrode of the second switch module, and a negative electrode of the switch tube T2 is the negative electrode of the second switch module. An anode of the separate diode is connected to the positive electrode of the second switch module, a cathode of the separate diode is connected to one end of the energy storage capacitor, and the other end of the energy storage capacitor is connected to the negative electrode of the first switch module. The damping resistor R1 is connected in parallel with the arrester DL and then connected in parallel between the positive electrode and the negative electrode of the first switch module. The bypass switch K1 is connected in parallel between the terminal x1 and the terminal x2 of the damper topology circuit. The power supply system acquires energy from the energy storage capacitor C1 and supplies power to the control system. The control system controls an operating state of the damper topology circuit by sending a control signal to the bypass switch K1, the first switch module and the second switch module.

As a preferred embodiment, the operating state of the damper topology circuit is an activation forward current charge state, a bidirectional current flow state, a forward current recharging state, a fault current damping state, or a fault bypass state: (1) activation forward current charge state: the control system does not send the control signal, the bypass switch K1 is turned off and the switch tube T1 and the switch tube T2 are also turned off; and a forward current flows through the freewheel diode D2, the energy storage capacitor C1 and the freewheel diode D1, such that the energy storage capacitor C1 is charged by the separate diode D3 and the freewheel diode D1, at which time, the power supply system and the control system of a damper are not activated; (2) bidirectional current flow state: the control system controls the switch tube T1 and the switch tube T2 to be turned on, such that currents can flow bidirectionally; and a forward current flows through the switch tube T2 and the freewheel diode D1, and a reverse current flows through the switch tube T1 and the freewheel diode D2; (3) forward current recharging state: the control system controls the switch tube T1 to be turned on and the switch tube T2 to be turned off, at a forward current, such that the forward current charges the energy storage capacitor C1 by the separate diode D3 and the freewheel diode D1; (4) fault current damping state: in case of an external fault of the damper topology circuit, the control system controls the switch tube T1 and the switch tube T2 to be turned off, and a fault current flows through the freewheel diode D2 and the damping resistor R1 suppress the fault current; (5) fault bypass state: in case of an inner fault of the damper topology circuit, the control system controls the bypass switch K1 to be turned on to cut off the fault current-suppressing damper topology circuit. The switch tubes T1 and T2 each are an IGBT, an IGCT, a GTO, or a MOSFET. The second switch module is a bidirectional thyristor. The bypass switch K1 has a post-closing mechanical retention function, and can retain a closed state after a power off.

As shown in FIG. 1, the fault current-suppressing damper topology circuit includes two switch modules, one separate diode D3, one energy storage capacitor C1, one damping resistor R1, one arrester DL, one bypass switch K1, one power supply system, and one control system. A positive electrode of the switch module T1 is connected to a leading-out terminal x2 of the damper topology circuit, a negative electrode of the switch module T1 is connected to a negative electrode of the switch module T2, and a positive electrode of the T2 is connected to a leading-out terminal x1 of the damper topology circuit. An anode of the separate diode D3 is connected to the positive electrode of the switch module T2, a cathode of the separate diode D3 is connected to one end of the energy storage capacitor C1, and the other end of the energy storage capacitor C1 is connected to the negative electrode of the switch module T1. The damping resistor R1 is connected in parallel with the arrester DL and then in parallel with the switch module T1. The bypass switch K1 is connected in parallel between the terminal x1 and the terminal x2 of the damper topology circuit. The power supply system acquires energy from the energy storage capacitor and supplies power to the control system. The control system controls an operating state of the damper topology circuit.

Embodiment 2

Figure 2:
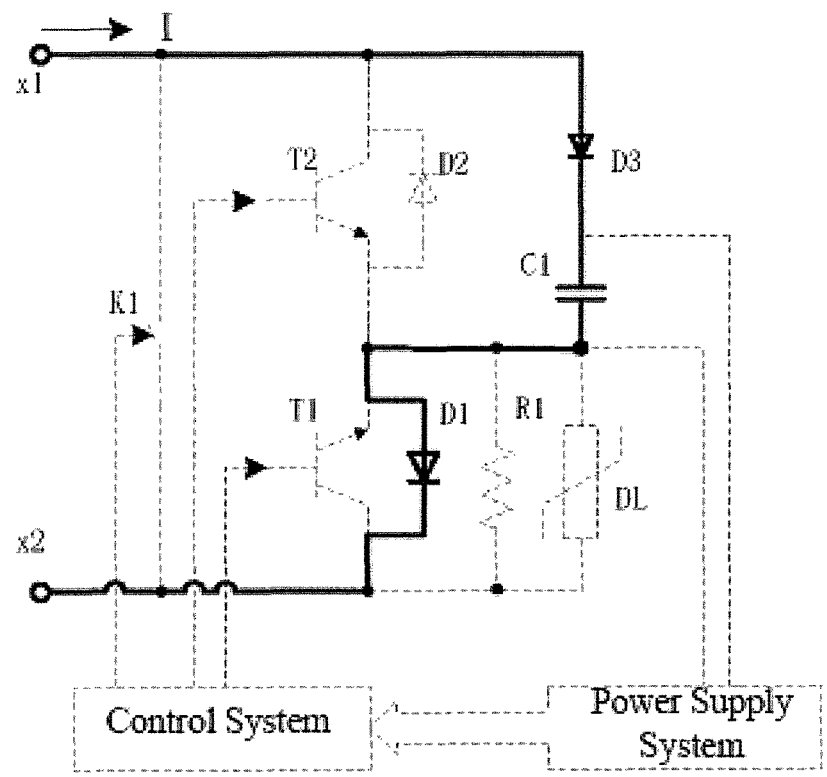
FIG. 2 shows an operating state of pre-charge of the fault current-suppressing damper topology circuit of the present invention.
Figure 3:
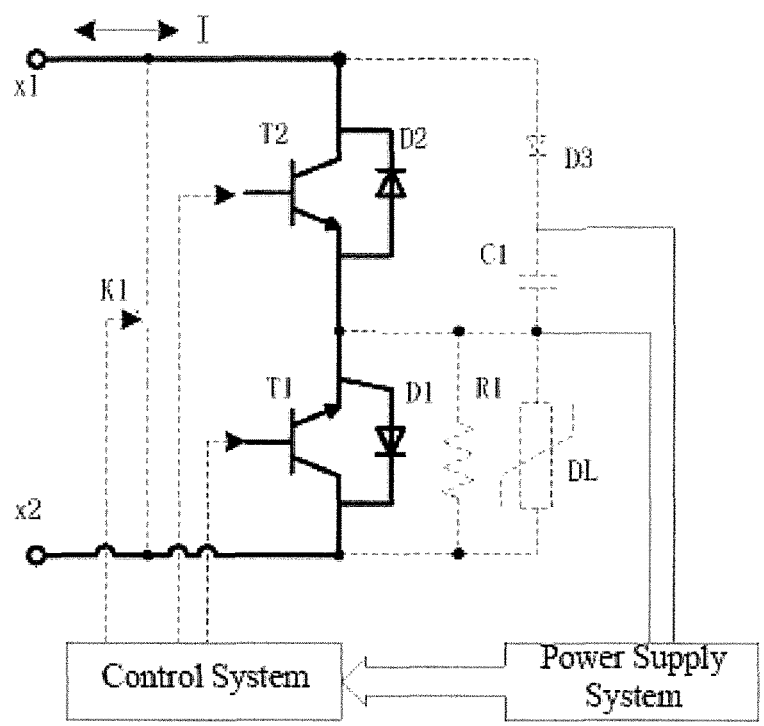
FIG. 3 shows an operating state of normal through-flow of the fault current-suppressing damper topology circuit of the present invention.
Figure 4:
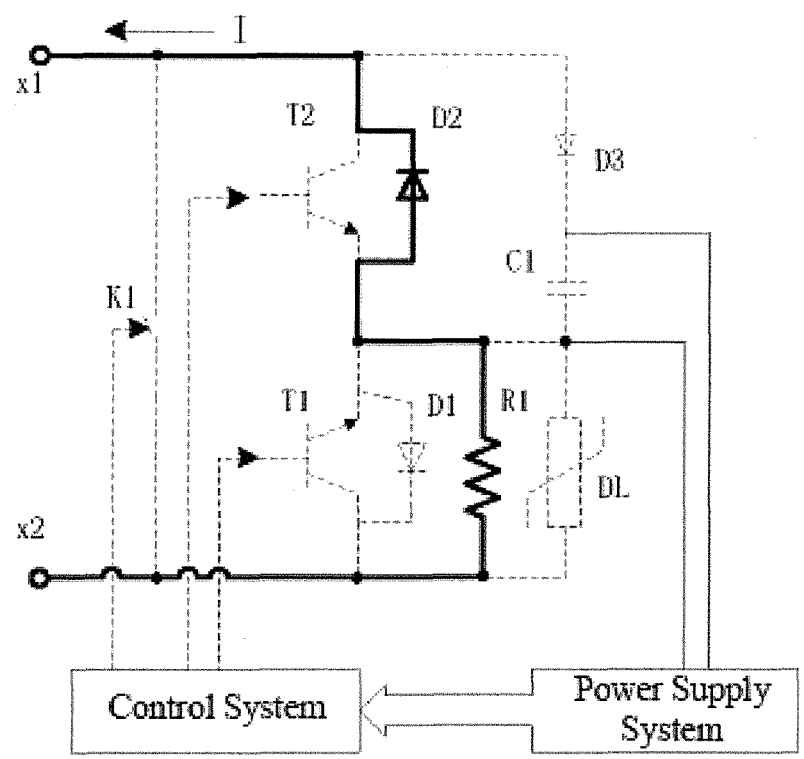
FIG. 4 shows an operating state of use of a damping resistor of the fault current-suppressing damper topology circuit of the present invention.
Figure 5:
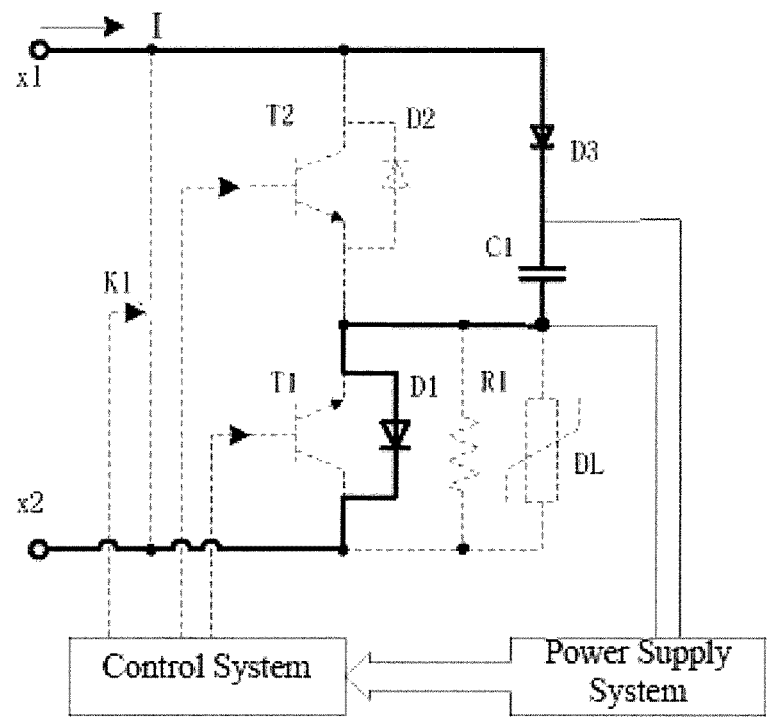
FIG. 5 shows an operating state of recharging of the fault current-suppressing damper topology circuit of the present invention.
Figure 6:
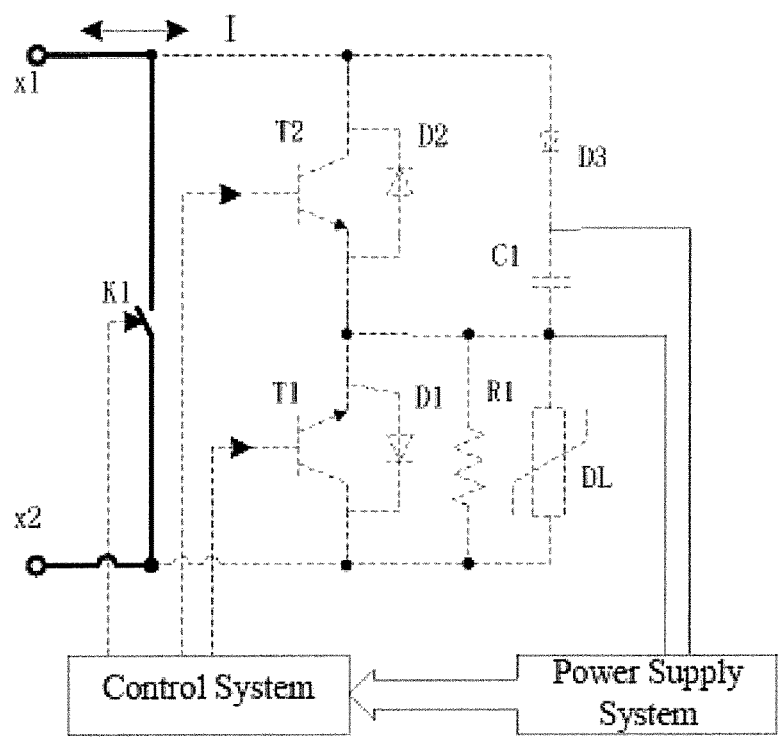
FIG. 6 shows an operating state of a bypass of the fault current-suppressing damper topology circuit of the present invention.

The present embodiment provides a control method of a fault current-suppressing damper topology circuit. The fault current-suppressing damper topology circuit is the same as that of embodiment 1, and thus is not described in detail. The control system sends a control signal to cause the fault current-suppressing damper topology circuit to operate in one of five operating states below:

(1) activation forward current charge state: the control system does not send the control signal, the bypass switch K1 is turned off and the switch tube T1 and the switch tube T2 are also turned off; and a forward current flows through the freewheel diode D1, the energy storage capacitor C1 and the freewheel diode D1, such that the energy storage capacitor C1 is charged by the separate diode D3 and the freewheel diode D1, referring to FIG. 2;

(2) bidirectional current flow state: the control system controls the switch tube T1 and the switch tube T2 to be turned on, such that currents can flow bidirectionally; and a forward current flows through the switch tube T2 and the freewheel diode D1, and a reverse current flows through the switch tube T1 and the freewheel diode D2, referring to FIG. 3;

(3) forward current recharging state: the control system controls the switch tube T1 to be turned on and the switch tube T2 to be turned off, at a forward current, such that the forward current charges the energy storage capacitor C1 by the separate diode D3 and the freewheel diode D1, referring to FIG. 5;

(4) fault current damping state: in case of an external fault of the damper topology circuit, the control system controls the switch tube T1 and the switch tube T2 to be turned off, and a fault current flows through the freewheel diode D2 and the damping resistor R1 to suppress the fault current, referring to FIG. 4;

(5) fault bypass state: in case of an inner fault of the damper topology circuit, the control system controls the bypass switch K1 to be turned on to cut off the fault current-suppressing damper topology circuit, referring to FIG. 6.

Embodiment 3

Figure 7:
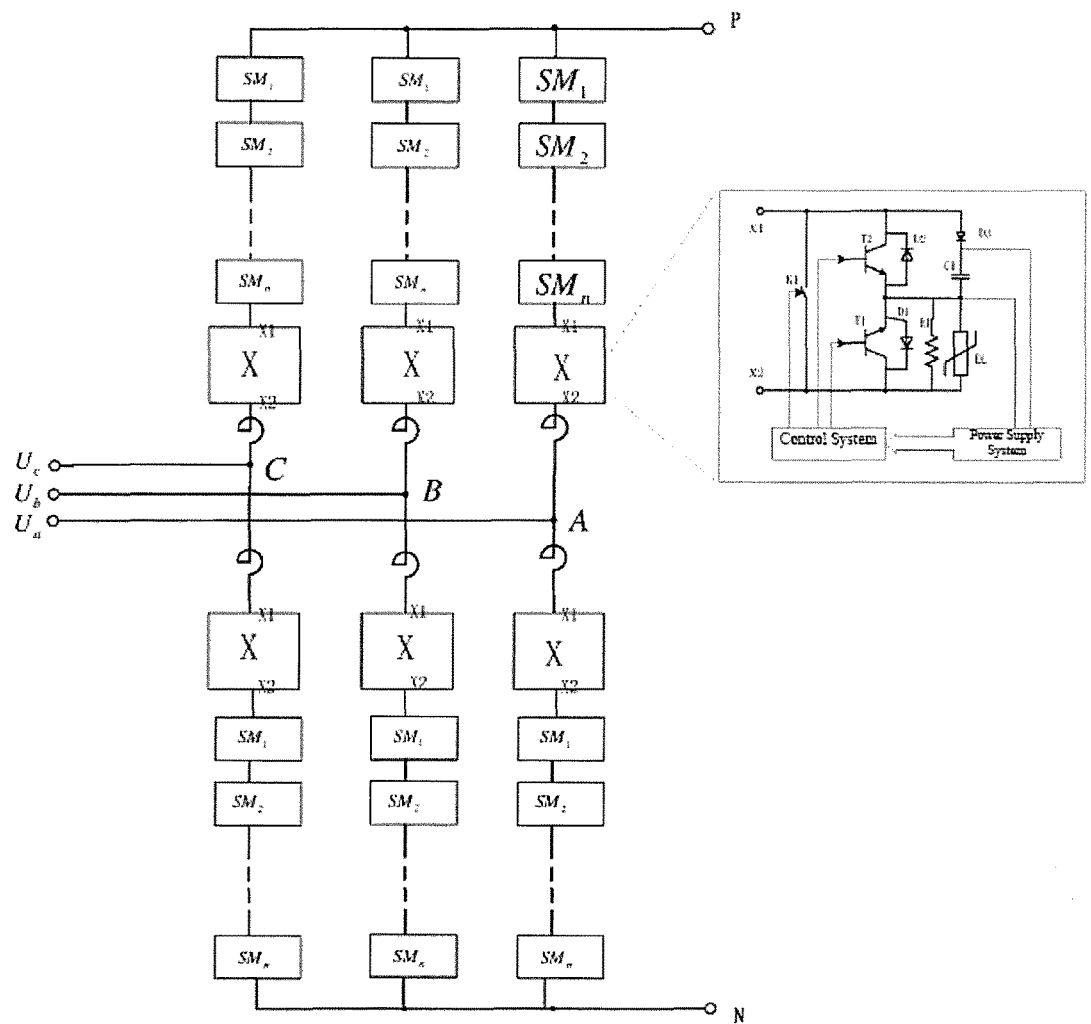
FIG. 7 shows an embodiment 1 of the present invention.

Referring to FIG. 7, a bridge arm damping modular multilevel converter includes an upper bridge arm and a lower bridge arm, the upper bridge atm and the lower bridge arm each include at least one fault current-suppressing damper topology circuit. The fault current-suppressing damper topology circuit is the same as that of embodiment 1, and thus is not described in detail.

As a preferred embodiment, the upper bridge aim and the lower bridge arm each include at least two half-bridge connected converter module units cascaded with each other. Ua, Ub and Uc respectively represents the network voltage of phase A, B and C. The converter module units in the upper bridge arm are connected in the same direction, and the converter module units in the lower bridge arm are also connected in the same direction. A first leading-out terminal of a first converter module unit in the upper bridge arm is a positive pole P of the modular multilevel converter, and a second leading-out terminal of a last converter module unit in the lower bridge arm is a negative pole N of the modular multilevel converter. The positive pole P and the negative pole N both are used to access a DC network. A second leading-out terminal of a last converter module unit in the upper bridge aim and a first leading-out terminal of a first converter module unit in the lower bridge arm are connected with each other, and the connection point is an AC endpoint of the modular multilevel converter and used to access an AC network. The fault current-suppressing damper topology circuit is a module unit type, and is compatible with the structure of the converter module unit. The fault current-suppressing damper topology circuits may be installed according to the locations of the converter module units.

The numbers of the converter module units included in the upper and lower bridge anus may be the same or different, and specific circuit structures of respective converter module units may be the same or different, where $SM_1$-$SM_N$ are converter module units, and X is a damper topology circuit. When a short-circuit fault occurs at a DC side, a turn-off signal is applied to switch modules of all damper topology circuits connected in series in the converter, and a fault current quickly decays. System operation is restored after the decay of the fault current is completed.

Embodiment 4

Figure 8:
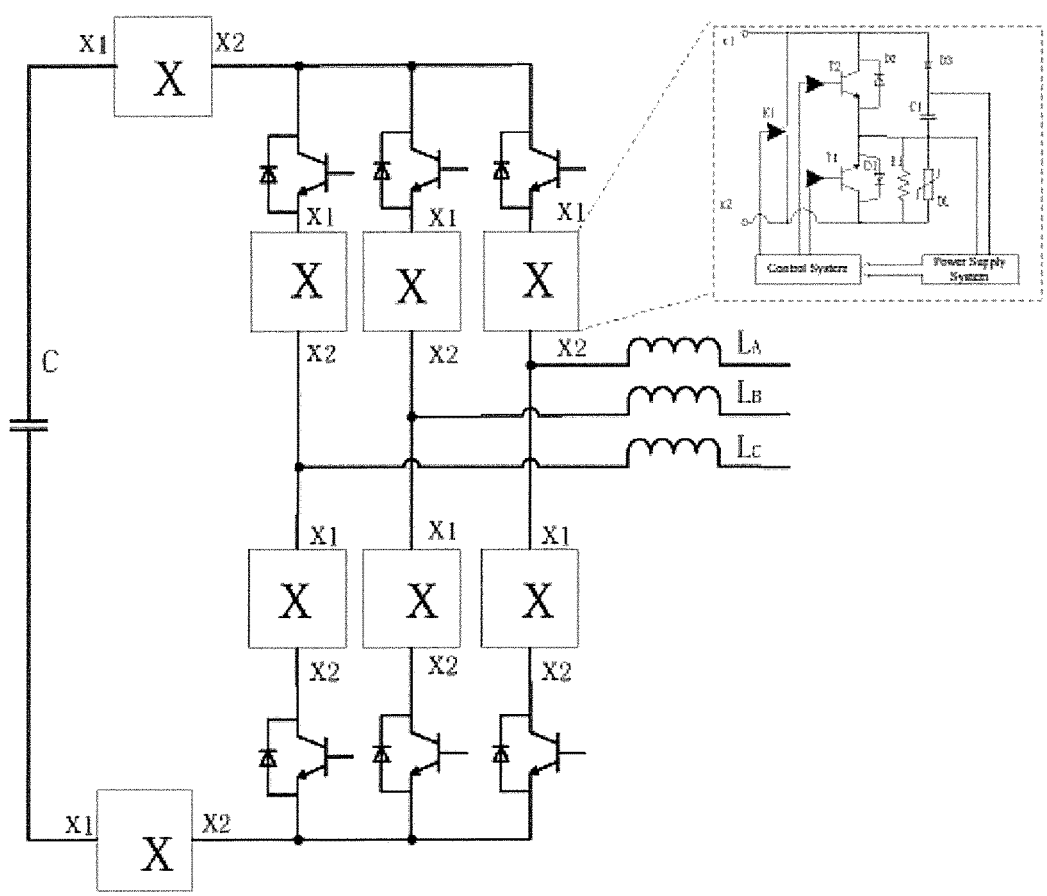
FIG. 8 shows an embodiment 2 of the present invention.

Referring to FIG. 8, a damping type two-level converter includes a phase unit, the phase unit including cascaded switch modules, and further includes at least one fault current-suppressing damper topology circuit in series with the switch modules. The fault current-suppressing damper topology circuit is the same as that of embodiment 1, and thus is not described in detail.

With reference to FIG. 8, $L_A$-$L_C$ represents the electric reactors connected with the phases A, B, and C of the converter respectively, and C represents the direct current capacitor. As a preferred embodiment, the fault current-suppressing damper topology circuit is also connected in series between the DC capacitor and the switch module. The damper topology circuit can be cascaded into a bridge arm or a DC capacitor loop. X is a damper topology circuit. When a short-circuit fault occurs at a DC side, a turn-off signal is applied to switch modules of all damper topology circuits connected in series in the converter, and a fault current quickly decays. System operation is restored after the decay of the fault current is completed.

Embodiment 5

Figure 9:
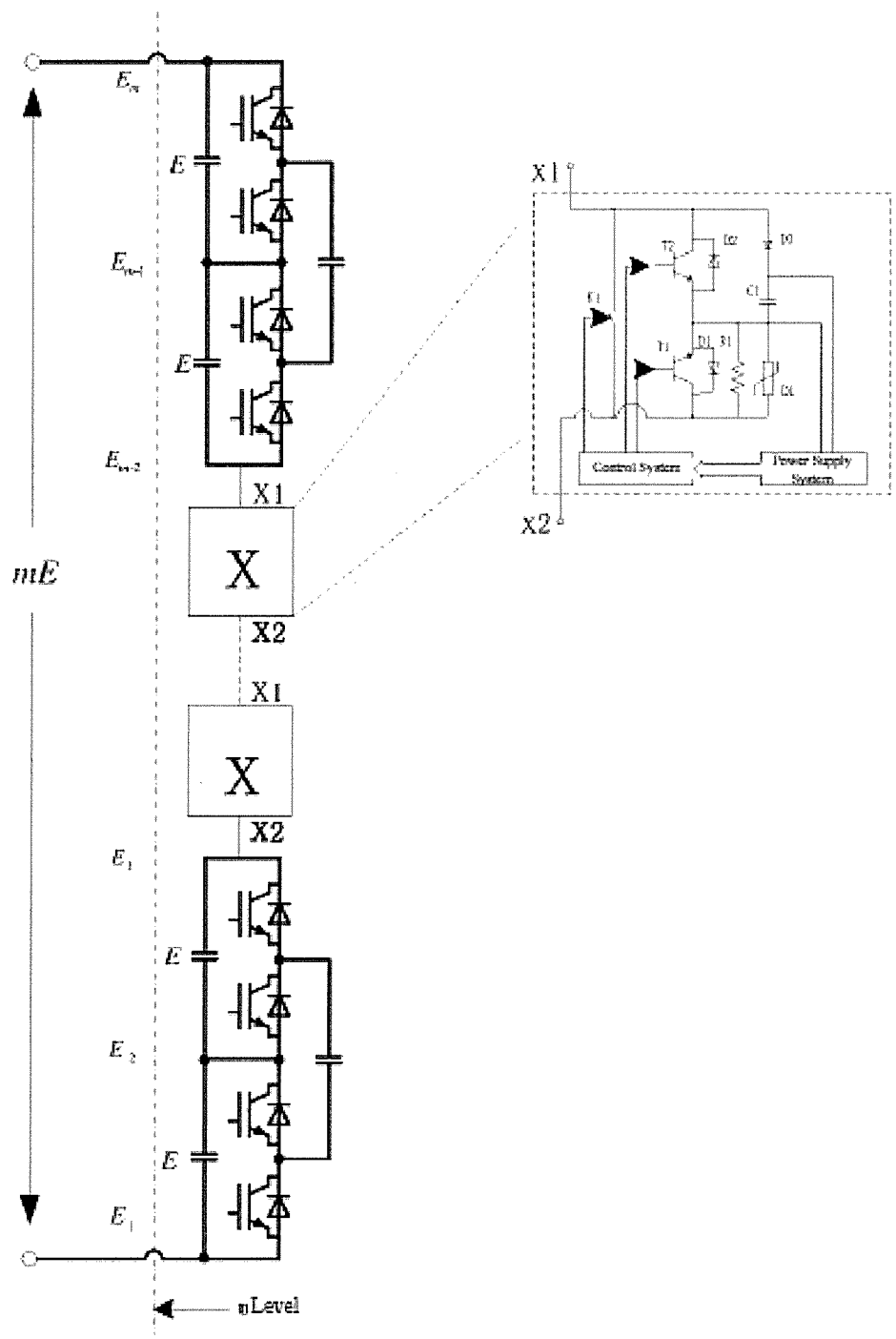
FIG. 9 shows an embodiment 2 of the present invention.

Referring to FIG. 9, a damping type multilevel converter includes a phase unit, the phase unit including at least one fault current-suppressing damper topology circuit cascaded, where E represents the capacitor voltage of submodule, the E1-En represents capacitor voltage of the submodule 1 to submodule n and mE represents the total capacitor voltage of m submodules The fault current-suppressing damper topology circuit is the same as that of embodiment 1, and thus is not described in detail. The damper topology circuit can be cascaded into a phase unit. X is a damper topology circuit. When a short-circuit fault occurs at a DC side, a turn-off signal is applied to switch modules of all damper topology circuits connected in series in the converter, and a fault current quickly decays. System operation is restored after the decay of the fault current is completed.

Embodiment 6

A method for protecting a modular multilevel converter includes the steps of: (1) detecting and determining whether a short-circuit fault occurs at a DC side; (2) if so, applying a turn-off signal to all switch modules connected in series in the modular multilevel converter; (3) restoring system operation after the decay of a fault current is completed. The method for protecting a modular multilevel converter is the same as that of embodiment 5, and thus is not described in detail.

The above embodiments are merely for illustration of the technical ideas of the present invention and are not intended to limit the scope of protection of the present invention, and various modifications made to the technical solutions based on the technical ideas of the present invention fall within the scope of protection of the present invention.

What is claimed is:

1. A fault current-suppressing damper topology circuit, comprising:
   a first switch module;
   a second switch module;
   a separate diode;
   an energy storage capacitor;
   a damping resistor;
   an arrester;
   a bypass switch;
   a power supply system; and
   a control system,
   wherein a positive electrode of the first switch module is connected to a second leading-out terminal of the damper topology circuit, and a negative electrode of the first switch module is connected to a negative electrode of the second switch module,
   wherein a positive electrode of the second switch module is connected to a first leading-out terminal of the damper topology circuit,
   wherein the first switch module comprises a first switch tube and a first freewheel diode in anti-parallel with the first switch tube,
   wherein the second switch module comprises a second switch tube and a second freewheel diode in anti-parallel with the second switch tube,
   wherein a positive electrode of the first switch tube is the positive electrode of the first switch module, a negative electrode of the first switch tube is the negative electrode of the first switch module, a positive electrode of the second switch tube is the positive electrode of the second switch module, and a negative electrode of the second switch tube is the negative electrode of the second switch module,
   wherein an anode of the separate diode is connected to the positive electrode of the second switch module, a cathode of the separate diode is connected to one end of the energy storage capacitor, and the other end of the energy storage capacitor is connected to the negative electrode of the first switch module,
   wherein the damping resistor is connected in parallel with the arrester and connected in parallel between the positive electrode and the negative electrode of the first switch module,
   wherein the bypass switch is connected in parallel between the first leading-out terminal and the second leading-out terminal of the damper topology circuit,
   wherein the power supply system acquires energy from the energy storage capacitor and supplies power to the control system,
   wherein the control system controls an operating state of the damper topology circuit by sending a control signal to the bypass switch, the first switch module and the second switch module.

2. The fault current-suppressing damper topology circuit of claim 1, wherein the operating state of the damper topology circuit is an activation forward current charge state, a bidirectional current flow state, a forward current recharging state, a fault current damping state, or a fault bypass state, wherein
   (1) in the activation forward current charge state, the control system does not send the control signal, the bypass switch is turned off and the first switch tube and the second switch tube are also turned off; and a forward current flows through the first freewheel diode, the energy storage capacitor and the first freewheel diode, such that the energy storage capacitor is charged by the separate diode and the first freewheel diode,
   (2) in the bidirectional current flow state, the control system controls the first switch tube and the second switch tube to be turned on, such that currents are capable of flowing bidirectionally; and a forward current flows through the second switch tube and the first freewheel diode, and a reverse current flows through the first switch tube and the second freewheel diode,
   (3) in the forward current recharging state, the control system controls the first switch tube to be turned on and the second switch tube to be turned off, at a forward current, such that the forward current charges the energy storage capacitor by the separate diode and the first freewheel diode,
   (4) in the fault current damping state, in case of an external fault of the damper topology circuit, the control system controls the first switch tube and the second witch tube to be turned off, and a fault current flows through the second freewheel diode and the damping resistor to suppress the fault current, and
   (5) in the fault bypass state, in case of an inner fault of the damper topology circuit, the control system controls the bypass switch to be turned on to cut off the fault current-suppressing damper topology circuit.

3. The fault current-suppressing damper topology circuit of claim 1, wherein the first switch tube and the second switch tube each are an IGBT (Insulated Gate Bipolar Transistor), an IGCT (Integrated Gate-Commutated Thyristors), a GTO (Gate Turn-Off Thyristor), or a MOSFET (Metal-Oxide-Semiconductor Field-Effect Transistor).

4. The fault current-suppressing damper topology circuit of claim 1, wherein the second switch module is a bidirectional thyristor.

5. The fault current-suppressing damper topology circuit of claim 1, wherein the bypass switch has a post-closing mechanical retention function, and retains a closed state after a power off.

6. A control method of the fault current-suppressing damper topology circuit of claim 1, wherein the control system sends a control signal to cause the fault current-suppressing damper topology circuit to operate in one of five operating states below:
   (1) an activation forward current charge state: the control system does not send the control signal, the bypass switch is turned off and the first switch tube and the second switch tube are also turned off; and a forward current flows through the first freewheel diode, the energy storage capacitor and the first freewheel diode, such that the energy storage capacitor is charged by the separate diode and the first freewheel diode;
   (2) a bidirectional current flow state: the control system controls the first switch tube and the second switch tube to be turned on, such that currents are capable of flowing bidirectionally; and a forward current flows through the second switch tube and the first freewheel diode, and a reverse current flows through the first switch tube and the second freewheel diode;
   (3) a forward current recharging state: the control system controls the first switch tube to be turned on and the second switch tube to be turned off, at a forward current, such that the forward current charges the energy storage capacitor by the separate diode and the first freewheel diode;
   (4) a fault current damping state: in case of an external fault of the damper topology circuit, the control system controls the first switch tube and the second switch tube to be turned off, and a fault current flows through the second freewheel diode and the damping resistor to suppress the fault current; and (5) a fault bypass state: in case of an inner fault of the damper topology circuit, the control system controls the bypass switch to be turned on to cut off the fault current-suppressing damper topology circuit.

7. A bridge arm damping modular multilevel converter, comprising an upper bridge arm and a lower bridge arm, wherein the upper bridge arm and the lower bridge arm each comprises at least one fault current-suppressing damper topology circuit of claim 1.

8. The modular multilevel converter of claim 7, wherein the upper bridge arm and the lower bridge arm each comprises at least two half-bridge connected converter module units cascaded with each other;

wherein the converter module units in the upper bridge arm are connected in the same direction, and the converter module units in the lower bridge arm are also connected in the same direction;

wherein a first leading-out terminal of a first converter module unit in the upper bridge arm is a positive pole P of the modular multilevel converter, and a second leading-out terminal of a last converter module unit in the lower bridge arm is a negative pole N of the modular multilevel converter;

wherein the positive pole P and the negative pole N both are configured to access a DC network;

wherein a second leading-out terminal of a last converter module unit in the upper bridge arm and a first leading-out terminal of a first converter module unit in the lower bridge arm are connected with each other; and the connection point is an AC endpoint of the modular multilevel converter and configured to access an AC network.

9. The modular multilevel converter of claim 7, wherein the fault current-suppressing damper topology circuit is a module unit type, and compatible with a structure of the converter module unit.

10. A damping type two-level converter, comprising a phase unit, wherein the phase unit comprises cascaded switch modules; wherein the damping type two-level converter further comprising: at least one fault current-suppressing damper topology circuit of claim 1 in series with each of the cascaded switch modules.

11. The two-level converter of claim 10, wherein the fault current-suppressing damper topology circuit is also connected in series between a DC capacitor and the switch module.

12. A method for protecting the modular multilevel converter of claim 10, comprising the steps of:

(1) detecting and determining whether a short-circuit fault occurs at a DC side;

(2) if so, applying a turn-off signal to all switch modules connected in series in the modular multilevel converter; and (3) restoring system operation after a decay of a fault current is completed.

13. A damping type multilevel converter, comprising a phase unit, wherein the phase unit comprising at least one fault current-suppressing damper topology circuit of claim 1 which is cascaded.

* * * * *